(12) United States Patent
Ito et al.

(10) Patent No.: US 6,566,861 B2
(45) Date of Patent: May 20, 2003

(54) PULSE SIGNAL GENERATOR

(75) Inventors: Tomoaki Ito, Tokyo (JP); Masami Tanaka, Tokyo (JP); Tadashi Kubota, Tokyo (JP); Yasuhiro Masuzaki, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 0 days.

(21) Appl. No.: 09/986,179

(22) Filed: Nov. 7, 2001

(65) Prior Publication Data

US 2002/0027463 A1 Mar. 7, 2002

(30) Foreign Application Priority Data

Jul. 18, 2000 (JP) .......................................... 2000-217126

(51) Int. Cl.[7] .............................. G01B 7/14; G01B 7/30
(52) U.S. Cl. ............................. 324/207.13; 324/207.25
(58) Field of Search ...................... 324/207.13, 207.15, 324/207.25, 207.26, 207.211, 174; 310/155, 68 B (56) References Cited

U.S. PATENT DOCUMENTS 4,236,093 A * 11/1980 Birnbaum .................... 310/155
6,140,727 A * 10/2000 Goto et al. .................... 310/155
6,384,595 B1 * 5/2002 Ito et al. .................... 324/207.13

FOREIGN PATENT DOCUMENTS

| DE | 3201811 | 9/1983 |
| EP | 0987522 | 3/2000 |
| EP | 0987523 | 3/2000 |

* cited by examiner

*Primary Examiner*—Edward Lefkowitz
*Assistant Examiner*—Subhash A Zaveri
(74) *Attorney, Agent, or Firm*—Kanesaka & Takeuchi (57) ABSTRACT

According to the invention there is provided a pulse signal generator comprising a plurality of magnetic elements arranged in an imaginable plane and capable of producing large Barkhausen jumps; a first unit for generating a magnetic field, which is changed by the object to be detected to cause the magnetic elements to produce the large Barkhausen jumps, the first unit consisting of a pair of magnet/yoke combinations provided on opposite sides of said imaginable plane such that their poles are oriented in opposite directions, forming a detecting area at an end thereof; a second unit for detecting the large Barkhausen jumps to produce corresponding pulse signals; and first and second adjusting yokes being movable on one of the magnet/yoke combinations along one of the magnetic elements and on the other of the magnet/yoke combinations along the other of said magnetic elements, respectively.

5 Claims, 11 Drawing Sheets

PULSE SIGNAL GENERATOR

BACKGROUND OF THE INVENTION

1. Field of the Invention

The present invention relates to pulse signal generators.

2. Description of the Related Art

Pulse signal generators responsive to the position or speed of a moving object or a variety of operations have been used in the fields of automatic controls, and electrical and electronics equipment.

An example of the pulse signal generators of this type is a rotation detector that employs an electromagnetic, light pick-up, or Hole or magnetic reluctance element. The electromagnetic type, however, suffers from a low output at low speed rotations. The light pick-up type requires a broadband d-c amplifier and a dust-proof structure. The Hole or magnetic reluctance type requires a plurality of elements and an amplifier. Some elements of the light pick-up/Hole/magnetic reluctance type are too sensitive to temperatures to be used in the atmosphere that can have a large temperature change. Consequently, where the rotation detector is used to detect the rotary speed or position of a crank or cam shaft of a car, it is impossible to detect very low to high speed rotations.

Japanese patent application Kokai No. 2000-101401 discloses a pulse signal generator that employs a magnetic element wire capable of producing large Barkhausen jumps to detect very low to high speed rotations. The pulse signal generator is able to resolve the above-mentioned problems but needs further improvements for use in automobiles, etc.

For example, in order to increase the change of a magnetic field applied to the magnetic element wire under set and reset conditions, an adjusting yoke is attached to the rear face of the magnet, the length of the magnetic element wire is reduced below a half of the length of the magnet and yoke combined, the magnetic fields by a pair of magnets are made different by changing the power, volume, or shape of the magnets, the position of the magnetic element wire is changed relative to the magnets, or the magnets are tilted relative to each other.

Also, it is necessary to reduce the manufacturing cost and size of a unit, the time for assembly and adjustment, variations in the product quality, and the product yield. Furthermore, there is a demand for a pulse signal generator capable of generating a pulse signal with high resolution to effect fine control of angles of a rotary object. The pulse signal generator of JP 2000-101401, however, fails to meet these requirements.

SUMMARY OF THE INVENTION

Accordingly, it is an object of the invention to provide a pulse signal generator capable of meeting such requirements as described above.

According to the invention there is provided a pulse signal generator comprising a plurality of magnetic elements arranged in an imaginable plane and capable of producing large Barkhausen jumps; a first unit for generating a magnetic field, which is changed by the object to be detected to cause said magnetic elements to produce said large Barkhausen jumps, said first unit consisting of a pair of magnet/yoke combinations provided on opposite sides of said imaginable plane such that their poles are oriented in opposite directions, forming a detecting area at an end thereof; a second unit for detecting said large Barkhausen jumps to produce corresponding pulse signals; and first and second adjusting yokes being movable on one of said magnet/yoke combinations along one of said magnetic elements and on the other of said magnet/yoke combinations along the other of said magnetic elements, respectively.

According to an embodiment of the invention, said magnetic elements are neither longer than said magnet/yoke combinations nor shorter than a half said magnet/yoke combinations.

According to another embodiment of the invention, one of said magnetic elements is arranged closer to one of said magnet/yoke combinations while the other of said magnetic elements is arranged closer to the other of said magnet/yoke combinations than said one of said magnet/yoke combinations.

According to still another embodiment of the invention, each of said magnet/yoke combinations is composed of a pair of magnet/yoke sub-combinations bonded together on the sides such that each of said magnetic elements and each of said adjusting yokes are arranged so as to correspond to one of said sub-combinations.

According to yet another embodiment of the invention there is provided a pulse signal generator system comprising a plurality of said pulse signal generators such that they are offset in a direction of motion of said object.

DESCRIPTION OF THE PREFERRED EMBODIMENTS

Embodiments of the invention will now be described with reference to the accompanying drawings.

Figure 1:
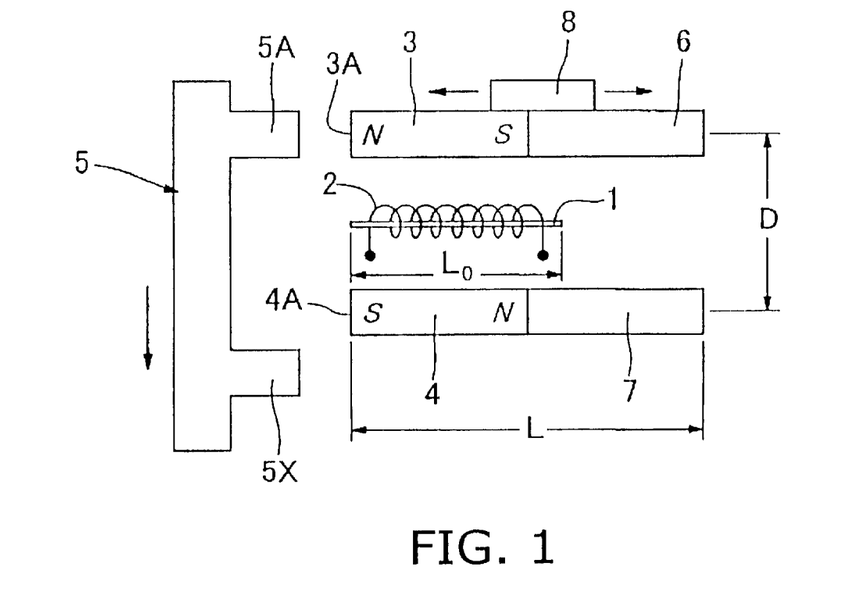
FIGS. 1 and 2 are side views of a pulse signal generator having a magnetic element wire capable of producing large Barkhausen jumps.
Figure 2:
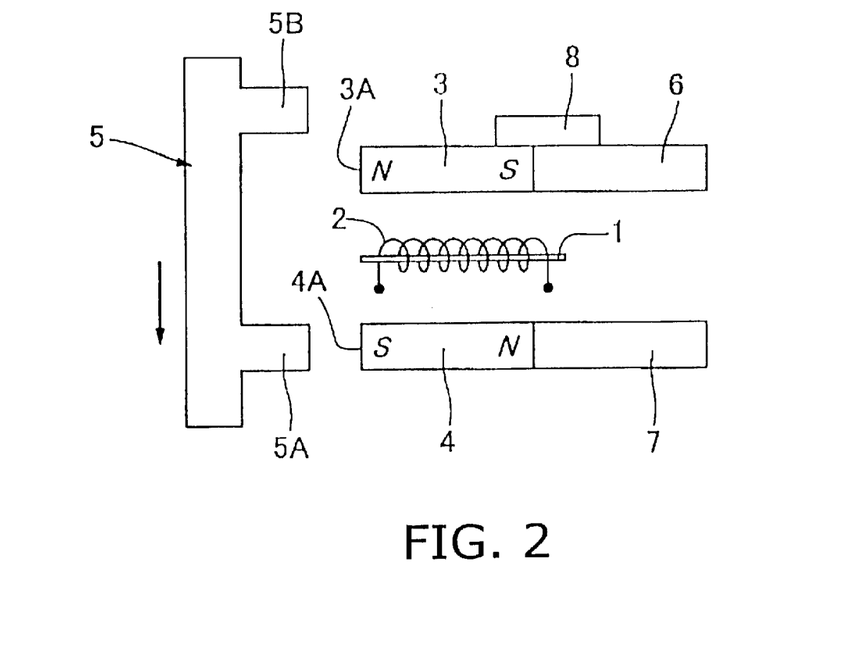

In FIGS. 1 and 2, a pulse signal generator comprises a wire-shaped magnetic element 1, a detecting coil 2 wound around the magnetic element 1, a pair of permanent magnets 3 and 4 disposed on opposite sides of the magnetic element 1 such that their poles are oriented in opposite directions, a pair of yokes 6 and 7 connected to the permanent magnets 3 and 4, respectively, and an adjusting yoke 8 movable along the permanent magnet 3 and the yoke 6 such that its position may be adjusted. The magnetic poles 3A and 4A of the permanent magnets 3 and 4 constitute a detecting area in which the magnetic field applied to the magnetic element 1 is changed by the motion of teeth 5A, 5B, . . . 5X of a toothed wheel 5 to generate large Barkhausen jumps which in turn produce a pulse signal across the detecting coil 2. The structure and function of the magnetic element 1 is described in JP 2000-101401 and, therefore, its detailed description will be omitted.

The permanent magnets 3 and 4 and the yokes 6 and 7 have magnetic axes parallel to the longitudinal direction of the magnetic element 1. The length of the magnetic element 1, Lo, is set between L and L/2 wherein L is the total length of the permanent magnet and the yoke combined. The adjusting yoke 8 is made of a magnetic block having a length less than the total length L and its position may be adjusted along the magnetic axis. The adjusting yoke 8 may be a block of permanent magnet.

In operation, as shown in FIG. 1, the tooth 5A of the toothed wheel 5 faces the N pole 3A of the permanent magnet 3 while the advanced tooth 5X already has passed the S pole 4A of the permanent magnet 4, under which the pulse signal generator is in the "set state". In FIG. 2, the toothed wheel 5 is moved in the direction of an arrow so that the tooth 5A faces the S pole of the permanent magnet 4 while the trailing tooth 5B does not reach yet the N pole 3A of the permanent magnet 3. The pulse signal generator is now in the "reset state", causing a large Barkhausen jump in the magnetic element 1 which in turn generates a pulse across the detecting coil 2. In this way, every time a tooth of the toothed wheel 5 passes through the vicinity of the magnetic poles 3A and 4A, a pulse is generated across the detecting coil 2.

The magnetic change due to the large Barkhausen jump produced in the magnetic element 1 is detected by the detecting coil 2 as a pulse voltage established by electromagnetic action. Consequently, a sequence of presence and absence of the teeth 5A, 5B, etc. of the toothed wheel 5 produces a sequence of large Barkhausen jumps in the magnetic element 1 regardless of the speed thereof, thus making it possible to produce a pulse signal. In this way, it is possible to detect the object moving at very low speeds. The generated pulse signal maintains a constant voltage and phase relationship. That is, the amplitude of the pulse voltage is kept at a constant level regardless of the speed of the object to be detected.

The operational principle will be described in more detail with reference to FIGS. 3–6.

Figure 3:
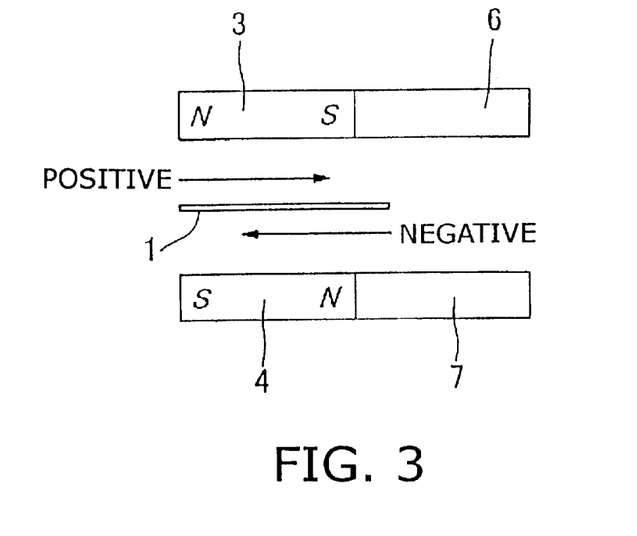
FIGS. 3–5 are side views of the pulse signal generator with no adjusting yoke equipped.

In FIG. 3, the magnetic fields applied to the magnetic element 1 provided between a pair of the permanent magnets 3 and 4 and the yokes 6 and 7 are indicated by arrows. Where the magnetic element 1 is provided in the middle between the upper and lower permanent magnets 3 and 4 that have the same size and equal magnetic power, the magnetic field upon the magnetic element 1 is zero (0) because the magnetic fields in the positive and negative directions applied to the magnetic element 1 by the upper and lower permanent magnets 3 and 4, respectively, have equal strengths and offset each other.

Figure 4:
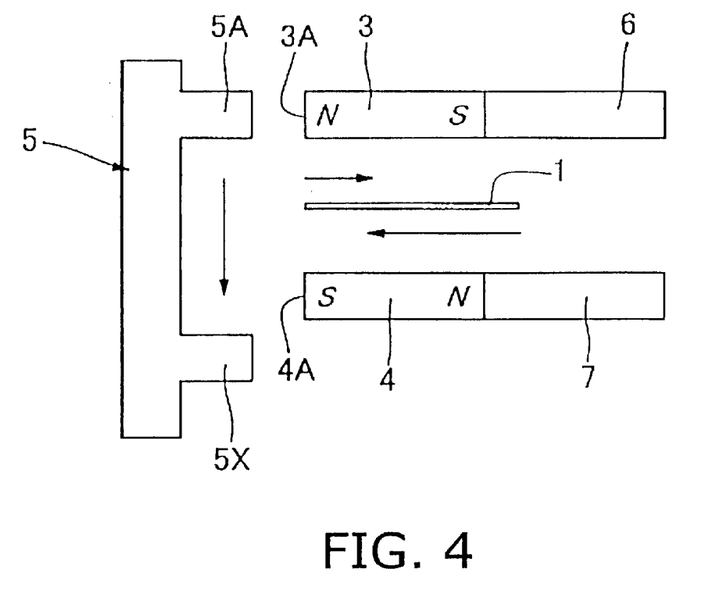

In FIG. 4, where the tooth 5A of the toothed wheel 5 faces the N pole 3A of the upper permanent magnet 3 or "set state", the magnetic fields applied to the magnetic element 1 are indicated by arrows. In the "set state", a considerable portion of the positive magnetic field produced by the upper permanent magnet 3 flows into the toothed wheel 5A, which is made of a magnetic material, so that the remaining field is reduced as indicated by the shorter arrow. The S pole 4A of the lower permanent magnet 4 does not face the tooth 5A so that the magnitude of the negative magnetic field upon the magnetic element 1 by the permanent magnet 4 is substantially equal to that of FIG. 3 in which no toothed wheel is provided. Consequently, as a whole, the negative magnetic field is applied to the magnetic element 1 in the "set state". This negative magnetic field is called hereinafter "second magnetic field."

Figure 5:
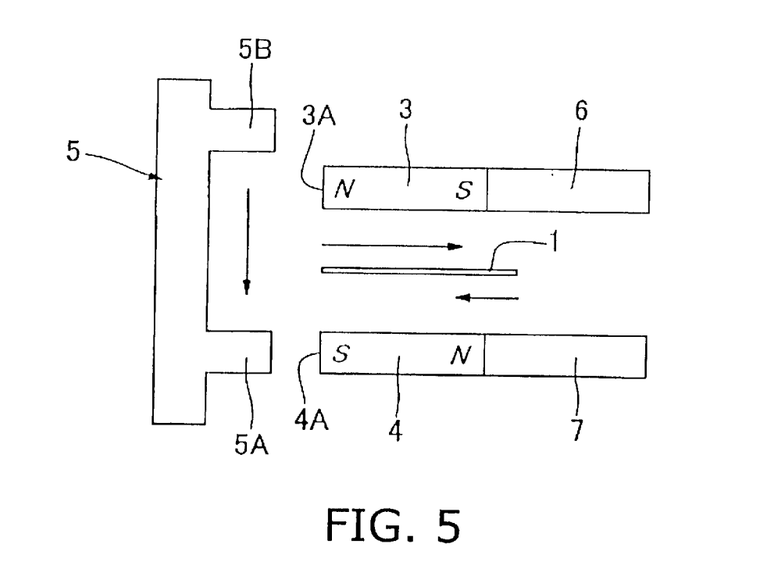

In FIG. 5, when the tooth 5A has moved from the N pole 3A of the upper permanent magnet 3 to the S pole 4A of the lower permanent magnet 4 or "reset state", the magnetic fields upon the magnetic element 1 between the permanent magnets 3 and 4 and the yokes 6 and 7 are indicated by arrows. In the "reset state," the negative magnetic field upon the magnetic element 1 by the lower permanent magnet 4 is reduced as indicated by the shorter arrow since a considerable portion thereof flows into the tooth 5A of the object to be detected. The N pole 3A of the upper permanent magnet 3 does not face the tooth 5B so that the positive magnetic field by the permanent magnet 3 is substantially equal to that of FIG. 3. Consequently, as a whole, the positive magnetic field is applied to the magnetic element 1 in the "reset state". This positive magnetic field is called hereinafter "first magnetic field."

Figure 6:
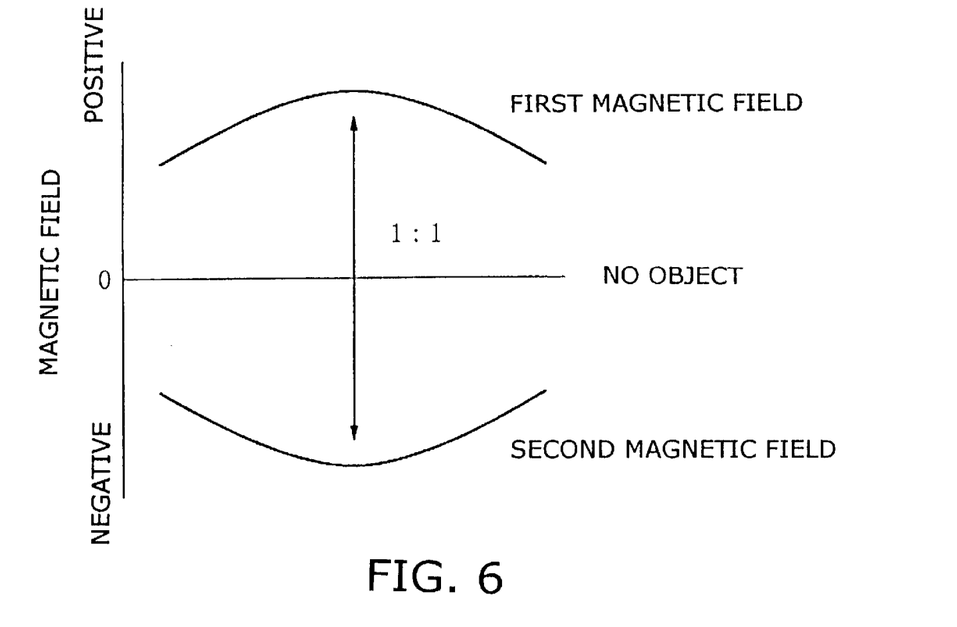
FIG. 6 is a graph showing respective magnetic fields on the magnetic element in FIGS. 3–5.

In FIG. 6, the magnetic fields applied to the magnetic element 1 in the states of FIGS. 3, 4, and 5 are shown. Sequential application of the second and first magnetic fields to the magnetic element 1 produces a sequence of large Barkhausen jumps, generating a sequence of pulses. If the first and second magnetic fields are set as shown in FIG. 6 (no adjusting yoke 8 is provided), their ratio becomes 1:1. In order to produce better large Barkhausen jumps, the ratio should be N:1 wherein N is a number except for 1. For this reason, the positions of the adjusting yoke 8 and the magnetic element 1 are specified, or the position of the adjusting yoke 8 is made changeable. In this embodiment, the adjusting yoke 8 is made movable along the longitudinal direction of the permanent magnet 3 and the yoke 6 to increase changes of the magnetic field upon the magnetic element 1 so that it is possible to shorten the adjusting time which in turn shortens the manufacturing time and increases the yield of the product.

Figure 7:
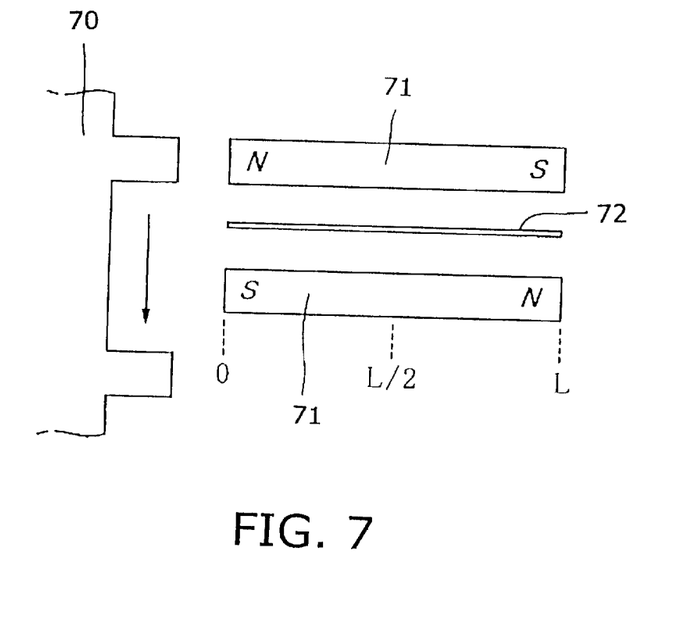
FIGS. 7 and 8 are side views of pulse signal generators for use in describing the production of better large Barkhausen jumps.
Figure 8:
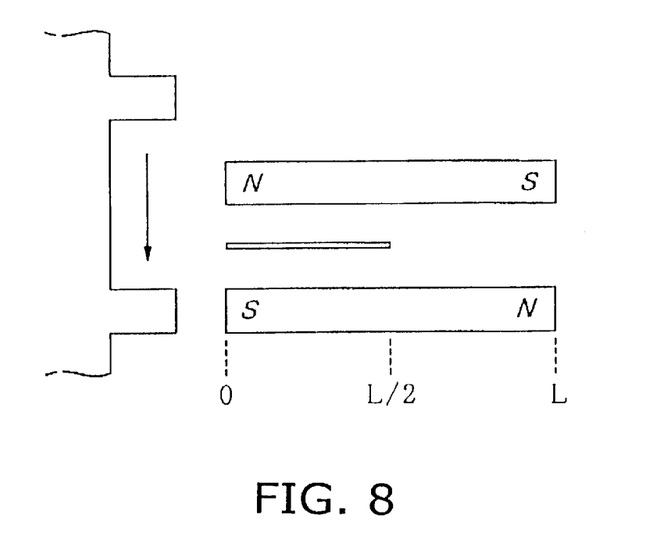
Figure 9:
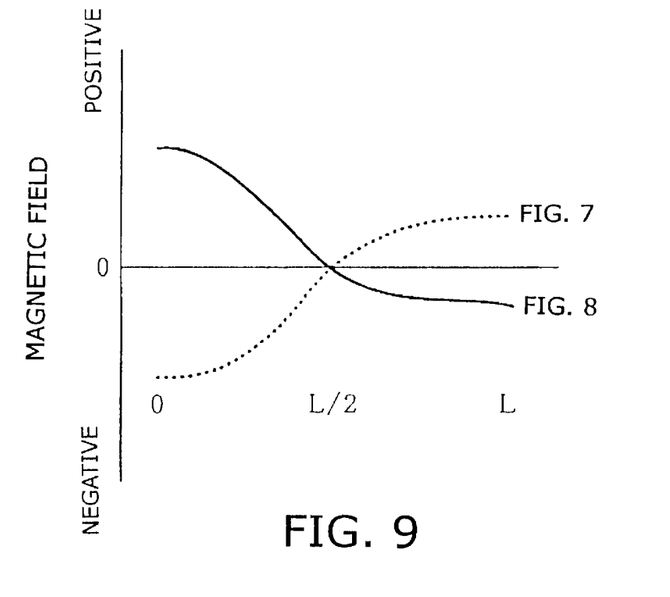
FIGS. 9 and 10 are graphs of magnetic fields upon the magnetic element.

In the aforementioned JP 2000-101401, the magnetic element 1 is positioned toward the front end of the permanent magnet to produce better large Barkhausen jumps. The reason will be described with reference to FIGS. 7–9. First of all, the pulse signal generator of this type needs an alternating magnetic field. As shown in FIGS. 7 and 8, when the object 70 moves, the magnetic fields on the magnetic element 72 provided between the magnets 71 change as shown in FIG. 9. The magnetic fields of FIG. 9 are obtained for the magnetic element 72 of FIG. 7. The magnetic field at a point of 0 is higher than that of a point of L because it is closer to the object. Where the magnetic element 72 is positioned as shown in FIG. 7, the positive-to-negative and negative-to-positive magnetic fields are used in intervals of 0-L/2 and L/2-L, respectively, so that the magnetic fields crash within the magnetic element 72. This collision of magnetic fields can be avoided by providing the magnetic element 73 of a half length of the magnetic element 72 in the area of either a front or rear half of the magnet as shown in FIG. 8. When the magnetic element 73 is positioned in the front half area, the alternating magnetic field becomes higher, producing better large Barkhausen jumps. If the front and rear magnetic fields are 5 and 2 (absolute value), respectively, the alternating magnetic fields becomes +5 and +2 for the front and rear magnetic positions, respectively. For the magnetic element 72 placed along the entire length of the magnet 71, the front-to-rear magnetic field becomes +3. Thus, the magnetic element 73 should be placed in the front position or toward the object to be detected.

Figure 10:
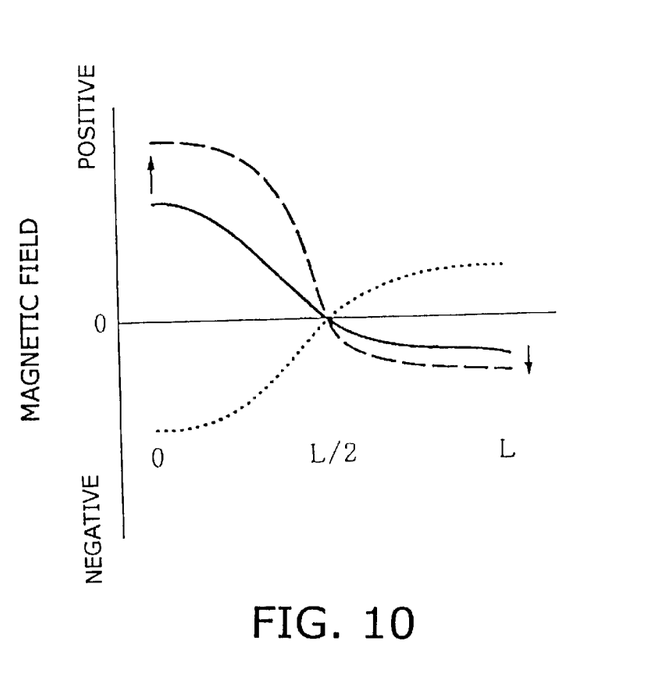

If the width of the magnet is increased, the magnetic power and the portion that acts on the object are increased so that the magnetic field (absolute value) is increased as shown by arrows in FIG. 10. That is, the magnitude of the alternating magnetic field increases, producing more improved large Barkhausen jumps. For the same reason, by specifying the length of the magnetic element between the entire length of (the magnet and the yoke) and a half thereof, it is possible to provide still better large Barkhausen jumps, which in turn makes it possible to reduce the size and the manufacturing cost of the product.

Figure 11:
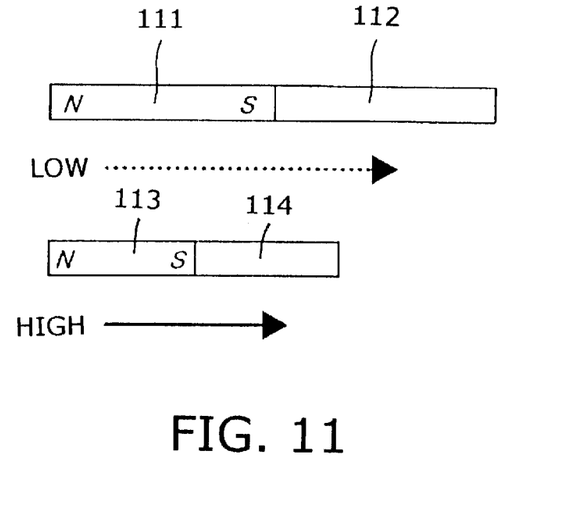
FIG. 11 is a side view of two different magnet/yoke combinations.

In FIG. 11, when the yoke 112 is connected to the magnet 111, the pole is established at the free end of the yoke 112, acting as one magnet. Consequently, a magnetic field is established along the magnet and yoke assembly as shown by a dotted arrow. Then, when a shorter magnet 113 and a shorter yoke 114 are connected, a similar but higher magnetic field is established as shown by a solid arrow because the poles are closer than before. The volume of the magnetic element is proportional to the power. That is, the length of the magnetic element is kept constant.

Figure 12:
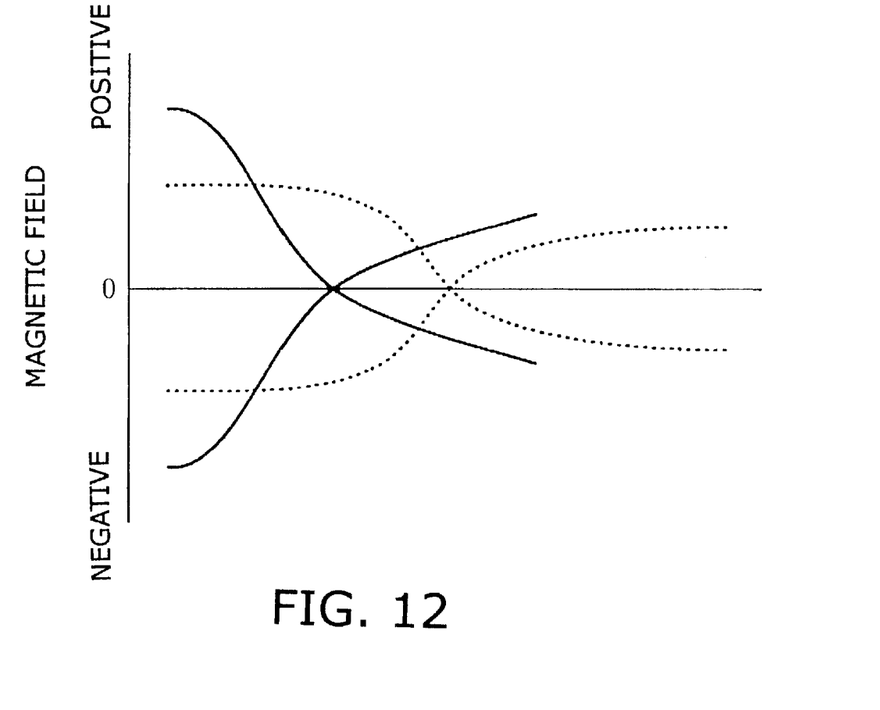
FIG. 12 is a graph of the magnetic fields produced by the magnet/yoke combinations of FIG. 11.

In FIG. 12, the alternating magnetic fields produced by the long and short magnets are indicated by dotted and solid lines, respectively. The magnetic element can not use effectively the alternating magnetic field of the dotted line but of the solid line. If the absolute values of the alternating magnetic field of the dotted line are 3 and 1 while the absolute values of the solid line are 5 and 2, then the magnetic element uses the alternating magnetic field of the dotted line having a value of 3 (=3–0) and the alternating magnetic field of the solid line having a value of 3 (=5–2). Thus, these alternating magnetic fields have the same value.

The distance D between the permanent magnets 3 and 4 and the yokes 6 and 7 is fixed in FIG. 1, but it may be made variable. If it is variable, it is easy to adapt for a toothed wheel with teeth arranged with a different pitch to generate a pulse signal adjusted accordingly. The magnetic element 1 may be a thin or thick film or plate, with the detecting coil 2 of the flat shape. Also, a single layer of magnetic element may be used. The detecting coil may be replaced by a Hole or MR element, or resonant circuit. The adjusting yoke may be replaced by the following means.

Figure 13:
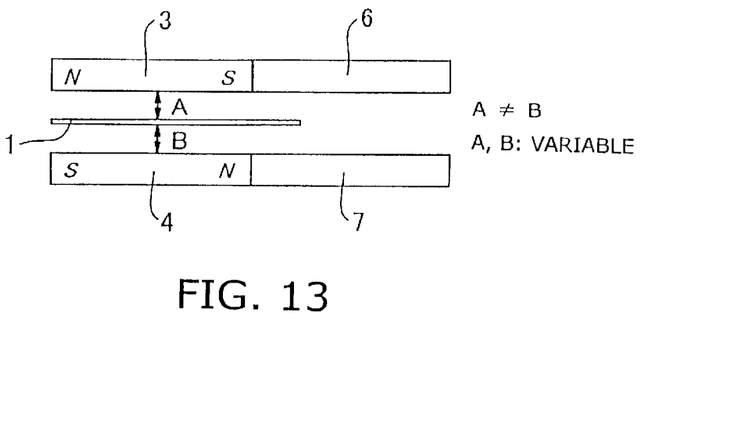
FIG. 13 is a side view of the magnet/yoke combinations and the magnetic element wire.

In FIG. 13, the distances A and B between the magnetic element 1 and the magnet 3 and between the magnetic element 1 and the magnet 4 are made different and variable.

Figure 14:
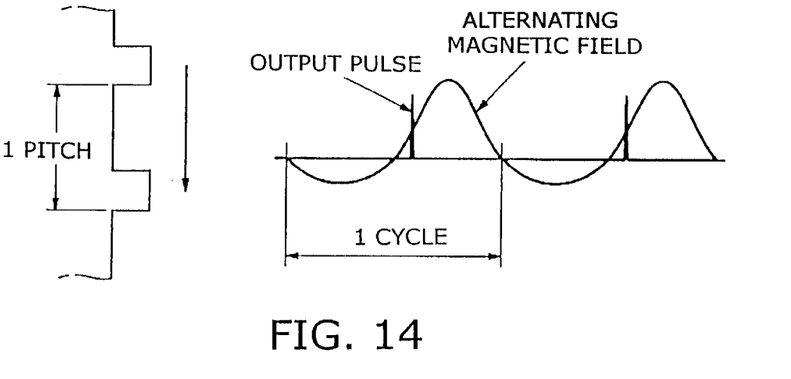
FIG. 14 is a diagram of an alternating magnetic field.

In FIG. 14, a pulse is generated in a pitch of the teeth. If the number of teeth of the toothed wheel is 36, then 30 pluses are generated for each turn of the toothed wheel; that is, a pulse for every 10 degrees of rotation. Consequently, control is made with a resolution of 10 degrees.

Figure 15:
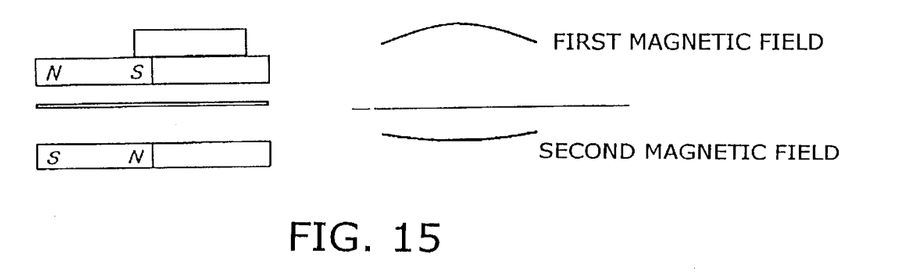
FIGS. 15 and 16 are side views of the magnet/yoke combinations and the magnetic element wire, with first and second magnetic fields.
Figure 16:
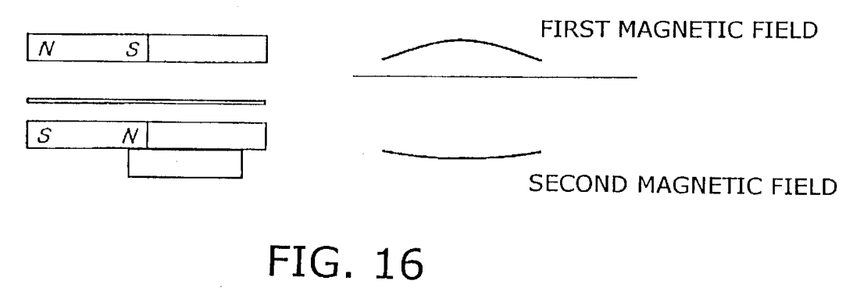
Figure 17:
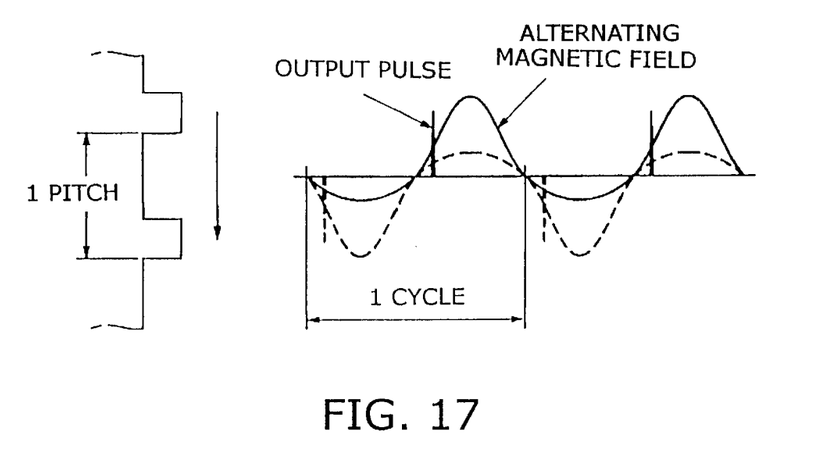
FIG. 17 is a diagram of an alternating magnetic field.

According to the invention there is provided a pulse signal generator having a resolution higher than 10 degrees of rotation. In FIG. 15, an asymmetric magnetic field in which the first magnetic field is higher than the second magnetic field, is provided by arranging the magnetic element wire closer to the upper magnet than the lower magnet and providing the adjusting yoke beside the upper magnet. In FIG. 16, an asymmetric magnetic field in which the first magnetic field is lower than the second magnetic field, is provided by arranging the magnetic element wire closer to the lower magnet than the upper magnet and the adjusting yoke beside the lower magnet. A comparison between FIGS. 15 and 16 shows that a magnetic field having a phase difference of 180 degrees is provided by arranging these two pulse signal generators side by side. Consequently, it is possible to generate a pulse at a position 180 degrees offset relative to the object or toothed wheel. This condition is shown in FIG. 17.

Figure 18:
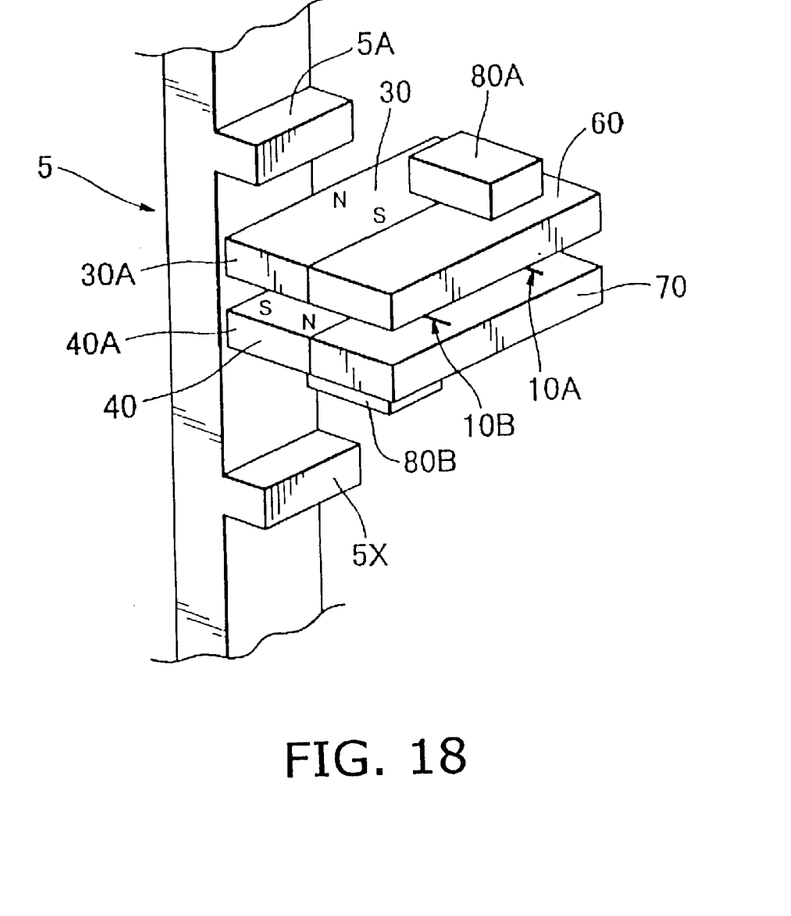
FIG. 18 is a perspective view of a pulse signal generator according to an embodiment of the invention.

In FIG. 18, a pulse signal generator according to an embodiment of the invention comprises a pair of permanent magnets 30 and 40 spaced by a predetermined distance and arranged such that their magnetic poles are oriented in opposite directions, a pair of yokes 60 and 70 connected to the S pole of the permanent magnet 30 and N pole of the permanent magnet 40, respectively, first and second magnetic element wires 10A and 10B provided between a pair of magnet/yoke combinations 30/60 and 40/70, a pair of detecting coils (not shown) provided around the first and second magnetic element wires 10A and 10B, respectively, and first and second adjusting yokes 80A and 80B movable along the top and bottom faces of the magnet/yoke combinations 30/60 and 40/70, respectively. The first and second magnetic element wires 10A and 10B are arranged closer to the magnet/yoke combinations 30/60 and 40/70 than the magnet/yoke combinations 40/70 and 30/60, respectively. The N and S poles 30A and 40A of the magnets 30 and 40 forms a detecting area in which the magnetic field upon the magnetic element wires 10A and 10B is changed responsive to a sequential motion of the teeth 5A, 5B, . . . 5X of the toothed wheel 5 to cause a sequence of large Barkhausen jumps in the magnetic element wires 10A and 10B, generating pulse signals across the detecting coils.

As has been described above with reference to FIGS. 15–17, the above pulse signal generator generates two pulses every time a tooth of the toothed wheel 5 passes through the detecting area. Consequently, it achieves twice the resolution of the aforementioned generator.

Figure 19:
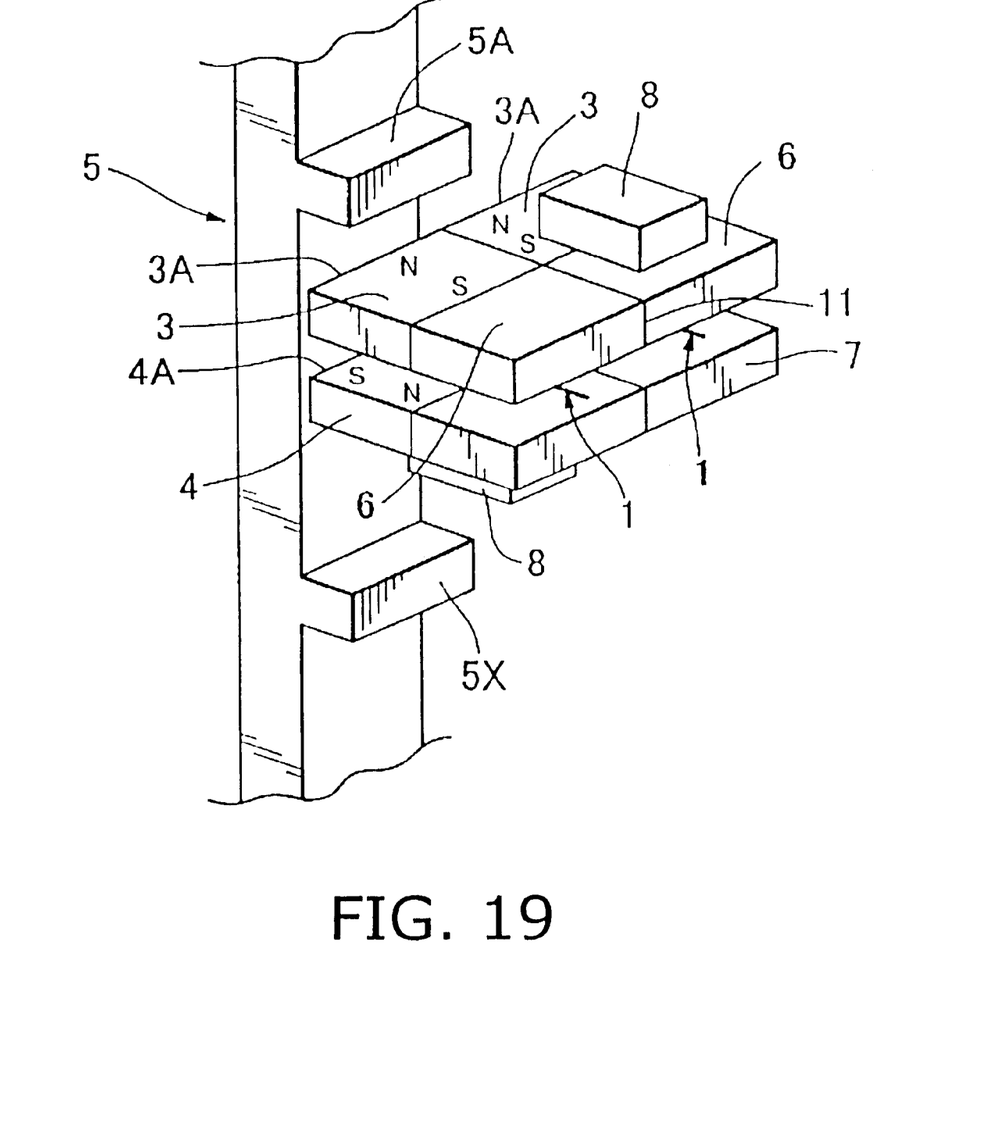
FIG. 19 is a perspective view of a pulse signal generator according to another embodiment of the invention.

In FIG. 19, this generator is composed of two pulse signal generators as described above with reference to FIGS. 1–2 and, therefore, the same parts are given like reference numerals. Each of left and right pulse signal generators comprises a pair of permanent magnets 3 and 4 spaced by a predetermined distance and disposed such that their magnetic poles are oriented in opposite directions, a pair of yokes 6 and 7 connected to the S and N poles of the permanent magnets 6 and 7, respectively, a magnetic element wire 1 disposed between a pair of magnet/yoke combinations 3/6 and 4/7, and a detecting coil (not shown) provided around the magnetic element wire 1. A pair of adjusting yokes 8 are made movable along the top and bottom faces of the right and left magnet/yoke combinations 3/6 and 4/7 for the right and left pulse signal generators, respectively. The magnetic element wires 1 for the right and left pulse signal generators are disposed closer to the magnet/yoke combinations 3/6 and 4/7 than the magnet/yoke combinations 4/7 and 3/6, respectively. The right and left pulse signal generators are bonded together with a bonding agent on side faces 11 of the magnet/yoke combinations 3/6 and 3/6, and 4/7 and 4/7, respectively.

The N and S poles of the magnets 3 and 4 form a detecting area in which the magnetic field upon the magnetic element wires 1 is changed by a sequential motion of the teeth 5A, 5B, . . . 5X of the toothed wheel 5 to cause a plurality of sequences of large Barkhausen jumps in the magnetic element wires which in turn generate a plurality of pulse signals across the detecting coils.

As has been described above with reference to FIGS. 15–17, this pulse signal generator system generates two pulses every time a tooth of the toothed wheel 5 passes through the detecting area. Consequently, it achieves twice the resolution of the aforementioned generator. The resolution is increased simply by putting two identical pulse signal generators together, resulting in the reduced costs.

Figure 20:
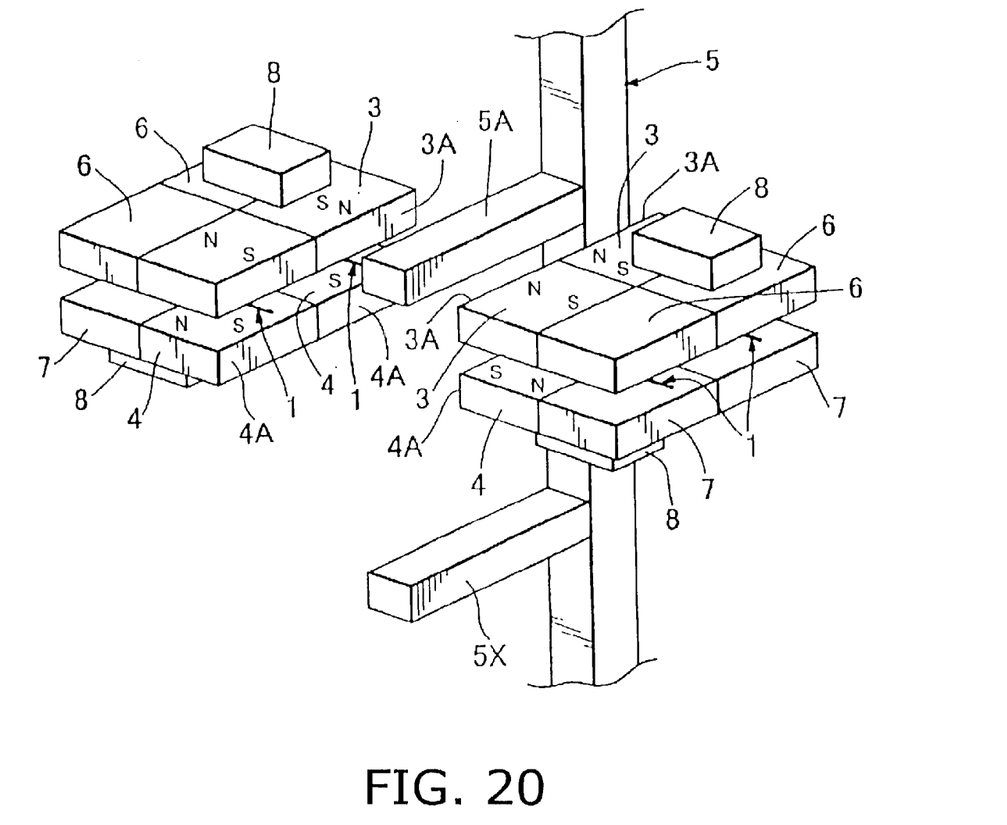
FIG. 20 is a perspective view of a pulse signal generator according to still another embodiment of the invention.

In FIG. 20, a pulse signal generator system according to still another embodiment of the invention comprises a pair of pulse signal generators of FIG. 19 disposed on both sides of the teeth 5A, 5B, . . . 5X of the toothed wheel 5 such that their detecting areas are offset by, for example, a half of the tooth pitch of the toothed wheel 5 in the moving direction (vertical direction in the figure). This pulse signal generator system generates four pulses whenever a tooth of the toothed wheel 5 passes through the detecting area. Consequently, it achieves four times higher the resolution than the aforementioned generator.

As has been described above, according to the invention, the manufacturing cost and the size of a pulse signal generator, its assembling and adjusting time, and variations in the product quality can be reduced. The resolution of the pulse signal generator is increased without difficulty so that the pulse signal generator is suitable for use in precise control of the angle of a rotary object, etc.

What is claimed is:

1. A pulse signal generator comprising:

first means for generating a magnetic field, which is changed by an object to be detected, said first means consisting of first and second elongated magnet/yoke combinations spaced by a predetermined distance such that their poles are oriented in opposite directions, forming a detecting area at an end thereof;

first and second magnetic elements provided between said first and second elongated magnet/yoke combinations and capable of producing large Barkhausen jumps in response to said change of said magnetic field, said first magnet element being arranged closer to said first magnet/yoke combination than said second magnet/yoke combination and said second magnetic element being arranged closer to said second magnet/yoke combination than said first magnet/yoke combination;

second means for detecting said large Barkhausen jumps to produce corresponding pulse signals; and first and second adjusting yokes, said first adjusting yoke being movable on said first elongated magnet/yoke combination along said first magnetic element and said second adjusting yoke being movable on said second elongated magnet/yoke combination along said second magnetic element.

2. The pulse signal generator according to claim 1, wherein said magnetic elements are neither longer than said magnet/yoke combinations nor shorter than a half said magnet/yoke combinations.

3. The pulse signal generator according to claim 1, wherein each of said magnet/yoke combinations is composed of a pair of magnet/yoke sub-combinations bonded together on the sides such that each of said magnetic elements and each of said adjusting yokes are arranged so as to correspond to one of said sub-combinations.

4. A pulse signal generator system comprising a plurality of said pulse signal generators according to claim 1, arranged such that they are provided on opposite sides of said object and offset in a direction of motion of said object.

5. A pulse signal generator system comprising a plurality of said pulse signal generators according to claim 3, arranged such that they are provided on opposite sides of said object and offset in a direction of motion of said object.

* * * * *